United States Patent [19]

Schap

[11] Patent Number: 5,039,925
[45] Date of Patent: Aug. 13, 1991

[54] POSITION ENCODER FOR SLIDING DOOR POWER DRIVE SYSTEM

[75] Inventor: William W. Schap, Muskegon, Mich.

[73] Assignee: ITT Corporation, New York, N.Y.

[21] Appl. No.: 587,296

[22] Filed: Sep. 24, 1990

[51] Int. Cl.⁵ .............................................. G05B 5/01
[52] U.S. Cl. .................................... 318/282; 318/466; 49/139
[58] Field of Search .............................. 318/282–286, 318/466–468, 626, 628, 640, 652, 480; 49/26, 43, 118, 138, 139, 199, 280, 324, 334, 360

[56] References Cited

U.S. PATENT DOCUMENTS

| | | | |
|---|---|---|---|
| 4,471,230 | 9/1984 | Yamamoto | 307/10.1 |
| 4,529,920 | 7/1985 | Yoshida et al. | 318/466 |
| 4,563,625 | 1/1986 | Kornbrekke et al. | 318/283 |
| 4,769,584 | 9/1988 | Irigoyen | 318/281 |
| 4,922,168 | 5/1990 | Waggamon et al. | 318/286 |
| 4,965,502 | 10/1990 | Ogasawara | 318/286 |

Primary Examiner—William M. Shoop, Jr.
Assistant Examiner—A. Jonathan Wysocki
Attorney, Agent, or Firm—Robert P. Seitter; J. Gordon Lewis

[57] ABSTRACT

A position encoder for a sliding door power drive system, such as those employed on van type vehicles, enables a positive drive powered operation of the door by a control switch remote from the door while accommodating manual operation of the door without mechanical interference or resistance from the drive or altering of the drive control program. A push/pull cable connected to the door is in positive meshed engagement at all times with a rotary drive gear whose rotative displacement from a rest position is continuously read by the position encoder and transmitted to a control unit as a door position input signal. During powered operation of the door, the control unit controls a bidirectional drive motor which is coupled to the drive gear via a normally disengaged clutch to drive the door to selected positions along its path of movement. The position encoder is formed of first and second photoelectric units mounted in spaced relationship with a rotative encoder wheel having spaced teeth separated by apertures. The first and second photoelectric units are spaced apart to independently detect the passage of different teeth as the encoder wheel rotates through its fixed engagement with the rotary drive gear. These signals are input to the control unit which calculates the actual position of the door, the direction of movement of the door and the rate of input of the signals to determine when the door reaches an end limit of movement as whether the door has struck an obstruction.

9 Claims, 4 Drawing Sheets

POSITION ENCODER FOR SLIDING DOOR POWER DRIVE SYSTEM

BACKGROUND OF THE INVENTION

The present invention relates to a power drive system for driving a sliding door in movement between an open and a closed position. It is particularly directed to a position encoder for a drive arrangement which accommodates shifting between manual and positively driven powered operation of the door at any position along its path of movement. While useful in other applications, the power drive system of the present invention is especially well adapted for use in operating the sliding door of a van type vehicle.

All power drive systems for sliding doors require a power system capable of driving an output member coupled to the door in either direction over a relatively long working stroke. In addition to the foregoing consideration applicable to sliding doors in general, further problems are presented where the drive is to power the sliding door of a van.

In the van application of the power drive system, the sliding door is conventionally mounted at the passenger side of the van and a major convenience of the system is that it may be power operated by control switches accessible from the driver's seat. However, if the driver is outside the van loading or unloading articles through the sliding door, the power controls are out of reach and there are many occasions where, in this situation, the driver will want to open or close the door manually. If the door is positively mechanically linked to the power source of the drive, this connection will interfere with manual operation of the door and, in the case of certain types of control systems, disturb a relationship between the door and drive relied upon by the control system to energize the drive motor when the door is at certain positions on its path of travel.

Since the door may be left in the fully closed or fully open positions or any position therebetween through either manual or powered movement, it is important that the actual position of the door be known at all times. This is necessary so that subsequent activation of the power controls will cause the door to move in the desired direction to a fully opened or fully closed position regardless of the door's starting position. Previously devised power door controls have utilized electromechanical limit switches to detect the fully closed and/or fully opened positions of the doors. However, no information was provided regarding the position of the door between either of these two positions.

Automatic power drive systems for other movable vehicle panels, such as vehicle windows, are also known. One such power window drive is manufactured by Kostal GmbH & Co., KG., Federal Republic of Germany. In this drive unit, an encoder has a shaft fixedly coupled to the window drive motor output shaft. The shaft rotates upon rotation of the drive motor output shaft and causes rotation of a circular member of the encoder. An open slot is formed in the circular member of the encoder which extends approximately one half around the circumference of the circular member. Two pairs of spaced, side-by-side mounted photoelectric emitters and receivers are mounted in the encoder on opposite sides of the slot and the adjacent solid portion of the circular member. Rotation of the circular member upon rotation of the window drive motor causes the light beams between each emitter and receiver pair to be alternately broken as the slot and solid portions of the circular member rotate between each emitter and receiver pair. Signals from the photoelectric pairs indicative of the number of times the light beams are broken are input to a processor which counts the number of such signals to deactivate the window drive motor when the window reaches the full opened or full closed positions. The direction of movement of the window is determined by the processor through the detection of the sequence of signals from the emitter and receiver photoelectric pairs.

This control unit can also be programmed to detect a stopped or impeded movement of the window while the direction selection switches are still depressed so as to automatically deactivate the drive motor, such as when an obstruction is met by the window moving to the fully closed position.

The position encoder of the present invention presents a practical solution to the problems discussed above.

SUMMARY OF THE INVENTION

In accordance with the present invention, the position encoder is utilized with a sliding door drive system having a push/pull cable coupled at one end to the door and guided in longitudinal movement within a guide track which extends parallel to the path of movement of the door along the lower edge of the door opening. The cable is driven in longitudinal movement by a bidirectional electric motor controlled by an electronic control unit in a manner such that the door may be smoothly moved to a fully opened or fully closed position and may be automatically stopped upon the sensing of an overload, such as the jamming of an object between the closing door and the door frame, or provided with a continuous, express operation and cancellation.

A wire-like member is helically wound in uniformly spaced turns around the core of the push/pull cable over its entire length and a drive gear rotatively mounted within a gear box fixed to the vehicle frame is tangentially engaged by the cable with the teeth of the drive gear in positive meshed engagement with the cable between adjacent turns of the wire. An idler roller freely rotatable within the gear box maintains the cable in meshed tangential engagement with the drive gear. Cable guide means in the gear box guide the cable through the gear box in a straight line path between the opposed peripheries of the idle and drive gear.

The cable projects from its guide track entirely through the gear box and the cable passes from the gear box into a storage housing having a spirally configured cable guide passage which compactly stores that portion of the cable projecting beyond the gear box. The gear box, reversible drive motor and storage housing may be conveniently mounted on the vehicle floor beneath the front passenger seat of the van.

The output shaft of the drive motor is positively connected via a second gear in the gear box to the input side of a normally disengaged centrifugal clutch. The output side of the clutch is positively meshed with the drive gear meshed with the cable. The clutch is so designed as to positively couple the input and output sides of the clutch only when its input side is driven in rotation by the drive motor. When the drive motor is not operating, the clutch elements are spring biased to a disengaged position so that the output side of the clutch and the drive gear meshed with the output side of the clutch may rotate freely to accommodate longitudinal movement of the cable through the gear box upon manual movement of the door.

The control means or electronic control unit which controls the operation of the drive motor is controlled in turn by a position encoder means which transmits signals to the control unit representative of the actual position of the door along its path of movement. The position encoder means includes first and second photoelectric means mounted in a spaced relationship with circumferentially spaced apertures in a toothed encoder wheel. Each of the first and second photoelectric means includes a light emitter and a light receiver. The light emitter and light receiver of each of the first and second photoelectric means are disposed on opposite sides of the periphery of the toothed encoder wheel to detect the passage of each tooth in the toothed wheel therepast. The receivers of each of the first and second photoelectric means generate signal pulses in response to rotary movement of the toothed encoder wheel which is rotatively fixed to the drive gear meshed with the cable. These pulses are input to the control unit which counts the pulses to determine the actual position of the door from its start rest position.

Essentially, the electronic control means counts the number of pulses transmitted to it by the position encoder means to determine the displacement of the door from its fully closed position and utilizes this information to control the motor. Insofar as the position encoder means is concerned, it transmits the same count to the control unit whether the encoder wheel is being driven in rotation by the drive motor during powered operation of the door or when the encoder wheel is being driven in rotation by manual movement of the door transmitted to the wheel via the meshed engagement between the push/pull cable and the drive gear upon which the encoder wheel is rotatively fixed. This enables shifting from manual to powered operation or vice versa when the door is at any position along its path of movement without requiring realignment of door position detecting system.

The first and second photoelectric means are spaced apart a distance such that each of the first and second photoelectric means is positioned to simultaneously detect the passage of a different tooth in the encoder wheel. Specifically, the first and second photoelectric means are positioned such that one of the first and second photoelectric means detects the transition from an aperture to a solid tooth portion of the encoder wheel as the wheel rotates in a first direction before the other of the first and second photoelectric means detects a transition between a different aperture and the solid tooth portion of the wheel. The timing of these signals is utilized by the control unit to determine the direction of rotation of the encoder wheel and, thereby the direction of movement of the door.

The control unit may also be programmed to calculate the rate or speed of input of the signals from the position encoder. The control unit utilizes this speed information to detect an abrupt deceleration of the door, such as that caused by the door striking an object in its path of movement or when the door reaches its fully opened or fully closed position. Upon detecting such a deceleration, the control unit immediately deactivates or reverses the drive motor.

The control unit may also be programmed to provide an express drive of the door when a control switch is momentarily activated. A subsequent momentary or prolonged activation of the control switch will cancel the express drive of the door. Further, when the control switch is activated for periods longer than the momentary express activation time, the control circuit will continue to activate the drive motor to drive the door only as long as the switch is activated by the operator.

DESCRIPTION OF THE PREFERRED EMBODIMENTS

Figure 1:
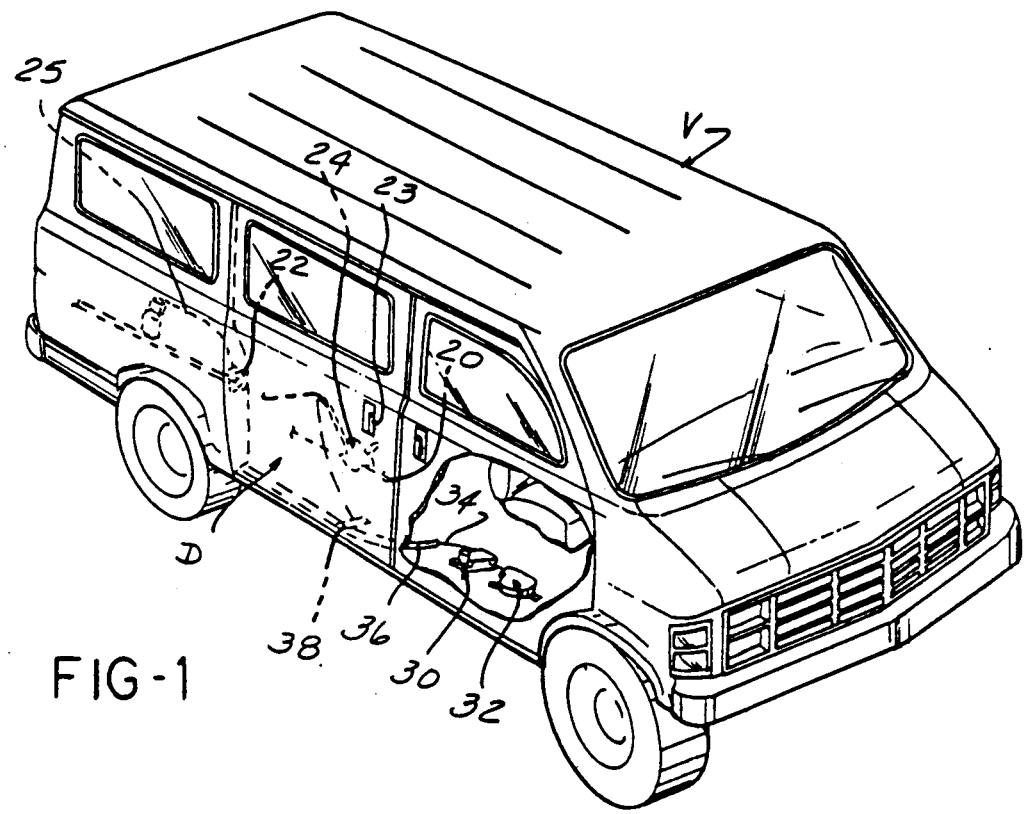
FIG. 1 is a perspective view of a vehicle, which certain parts broken away, showing the general location of certain components of the present invention within the vehicle.
Figure 2:
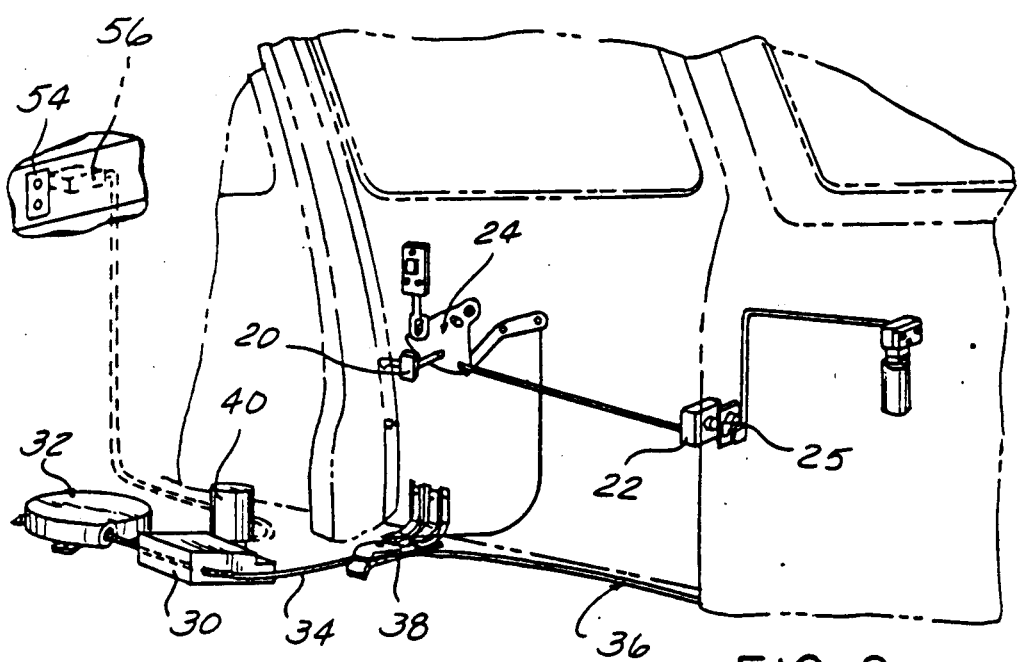
FIG. 2 is a perspective view of a portion of the interior of the vehicle of FIG. 1 with certain parts broken away or omitted for clarity.

In FIGS. 1 and 2, there is shown a vehicle, such as a van V, having a sliding door D located on the passenger side of the van V. Vans V utilizing such doors D have been available for many years and the structural arrangements by which the door D is mounted on the van V for manual movement between the closed position shown in FIGS. 1 and 2 in which the door D is sealingly seated in a door opening and an open position in which the door D is disposed at the side of the van V rearwardly of the door opening are well known. In the standard arrangement, the door D is latched in its closed position, typically by mechanical latches 20 and 22 at the front and rear edges of the door D, the latches being mechanically linked to a latch actuator 24 mounted within the door D to be simultaneously released by manual actuation of appropriate door handles 23. In many cases, the rear latch 22 may include a power driven striker mechanism 25 which latchingly engages the door D when the door D approaches its closed position and is power driven to move the latched door to its fully closed position.

The present invention is a position encoder for a sliding door power drive system by means of which the position of the door is constantly detected while the sliding door is power driven or manually moved in either direction between its open and closed positions. By way of example, the power drive system includes a motor driven gear box 30 which is selectively operable to drive an elongate flexible push/pull cable 34 in forward and rearward sliding movement within a cable guide track designated generally 36 fixedly mounted on the vehicle frame to extend along the lower edge of the door D opening along a path parallel to the path of movement of the door D between its open and closed positions. One end of the cable 34 is operatively coupled to the door D at a conventional door mounting bracket 38 so that power driven movement of cable 34 forwardly and rearwardly through guide track 36 drives the door D between its open and closed position. The coupling arrangement between cable 34 and door D is such that initial movement of cable 34 in a door opening direction is transmitted to latch release mechanism 24 to release the door latches.

Cable 34 extends forwardly of the vehicle from the front end of guide track 36, passes entirely through gear box 30 and extends forwardly from the gear box 30 into a cable storage housing 32, the cable 34 being fed into storage housing 32 during forward movement of cable 34 and being withdrawn from housing 32 during rearward movement. Gear box 30 and housing 32 may conveniently be mounted on the vehicle floor beneath the front passenger side seat. The motor 40 which drives cable 34 via gear box 30 is a reversible electrical motor controlled by appropriate directional switches 54 mounted on the vehicle dash within reach of the driver's seat, the switches 54 being operatively connected to motor 40 via an electronic control unit 56. Optionally, multiple switches 54 connected in parallel may be mounted at other different locations in the van V, if desired.

The employment of an electronic control unit 56 enables the power drive for the door D to be operated in a safe and efficient manner, as by smoothly driving the door D to an end limit of movement, by providing the door D with an anti-pinch capability by automatically stopping the drive if an object becomes trapped between the closing door D and the door frame, and by providing for express operation and eliminating the need for limit switches to sense specific door positions.

Figure 4:
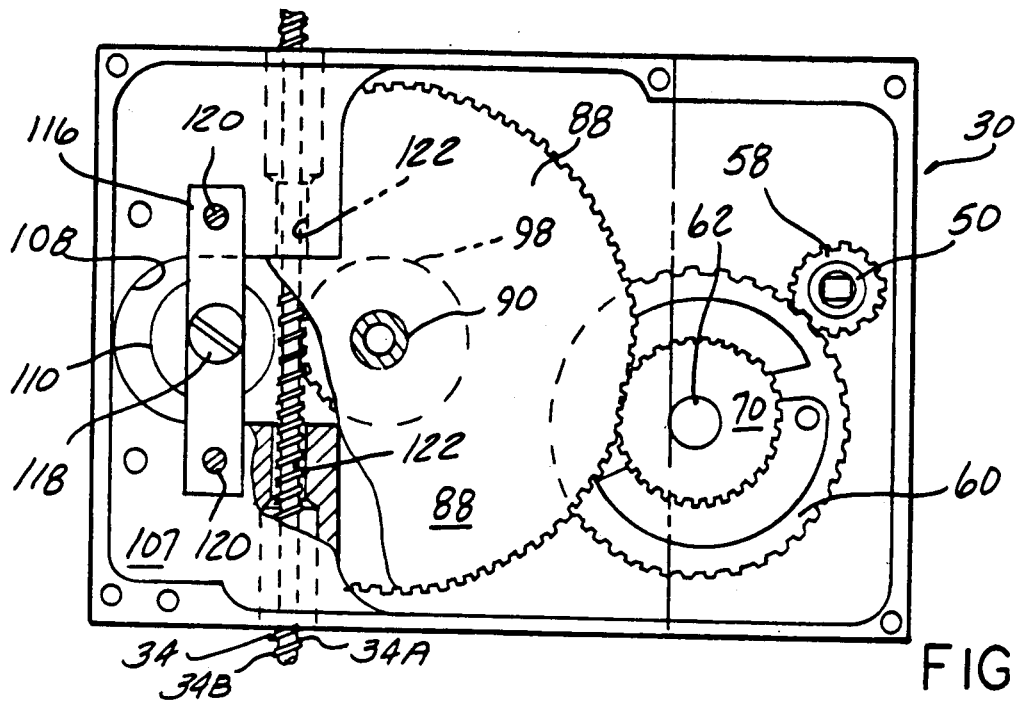
FIG. 4 is a top plan view of the interior of the gear box of FIG. 3 with the cover and certain parts removed for clarity.
Figure 3:
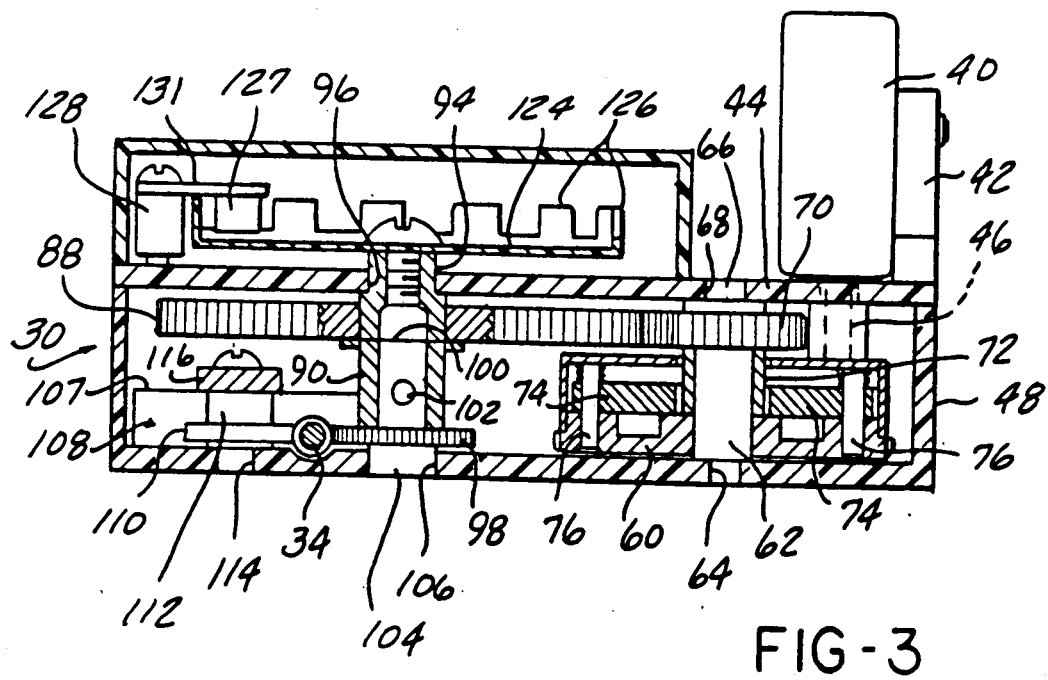
FIG. 3 is a detailed cross sectional view of the gear box shown in FIGS. 1 and 2.

Details of the gear box drive are best seen in FIGS. 3-6. Referring first to FIGS. 3 and 4, the reversible motor 40 is mounted upon a mounting bracket 42 resiliently mounted on the cover 44 of gear box 30 with a flexible motor shaft 46 projecting downwardly through a hole in cover 44 into the interior of the base 48 of the gear box. Flexible motor shaft 46 is slidably received within and rotatively locked to the hub 50 of a pinion gear 58 mounted for rotation about a fixed axis within gear box base 48. As best seen in FIG. 3, pinion 58 is operatively meshed with a drive gear 60 which is freely rotatable about a shaft 62 whose lower end (FIG. 3) is received in a slip fit in a bore 64 in the bottom of housing base 48 and whose upper end 66 is received within a bore 68 in housing cover 44.

Gear 60 constitutes the input member of a centrifugal clutch whose output member is constituted by a second gear 70 having a downwardly projecting hub 72 which is press fitted on shaft 62 for rotation relative to gear 60.

Figure 5:
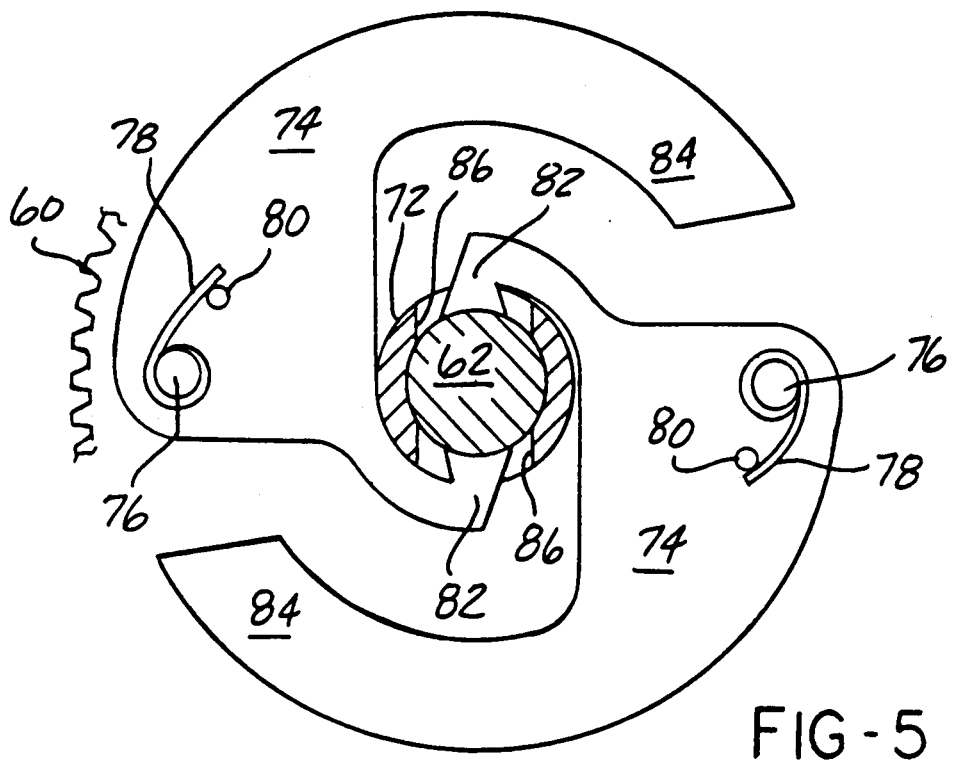
FIG. 5 is a top plan view, partially in section, of elements of a centrifugal clutch showing the clutch engaged.
Figure 6:
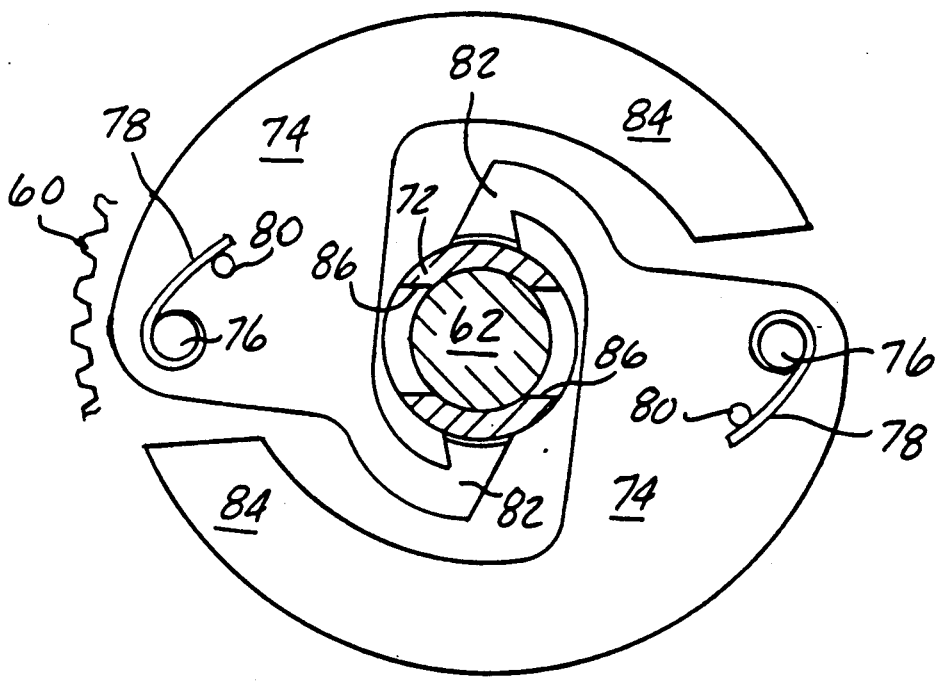
FIG. 6 is a plan view of the clutch as shown in FIG. 5 showing the clutch elements disengaged.

Referring now to FIGS. 5 and 6, the centrifugal clutch takes the form of a pair of clutch pawls 74 pivotally mounted upon gear 60 by a pair of pivot pins 76 located at diametrically opposed positions on gear 60. Torsion springs 78 engaged between pins 76 and stop pins 80 fixedly mounted on pawls 74 resiliently bias the pawls 74 in a clockwise direction about their respective pivot pins 76 as viewed in FIGS. 5 and 6 to the disengaged position shown in FIG. 6.

Each of the pawls 74 is formed with a pawl tooth 82 at one extremity of pawl 74 and an arcuate arm portion 84 at the opposite extremity. Arm portion 84 locates the center of mass of the pawl 74 relative to its pivot 76 so that upon rotation of gear 60 in either direction, the pawl 74 is urged by centrifugal force to swing the arm end 84 of the pawl 74 outwardly away from the shaft axis and thus swing the tooth portion of the pawl 74 radially inwardly toward the axis of shaft 62. The hub 72 of gear 70 is formed with opposed axial slots 86 into which the teeth 82 of pawls 74 may project upon centrifugally induced pivotal movement of the pawls 74 to establish a positive rotary drive coupling between the input gear 60 of the clutch and its output gear 70. When gear 60 is not being driven in rotation, springs 78 will resiliently bias their respective pawls 74 in a direction locating the pawl teeth 82 clear of the outer periphery of hub 72 of gear 70 and, with the clutch so disengaged, gear 70 and its hub 72 ca rotate freely relative to both gear 60 and shaft 62.

Referring now to FIGS. 3 and 4, the clutch output gear 70 is meshed with a relatively large diameter pinion gear 88 rotatively fixed to a hollow tubular hub 90 whose upper end 94 is rotatively received within a bore 96 in housing cover 44. A drive gear 98 is formed with an integral shaft 100 received within the lower end of hub 90 and rotatively locked to the hub as by a pin 102. A stub shaft 104 integral with gear 90 projects downwardly from the gear and is rotatively received within a bore 106 in the bottom of housing base 48.

At the left hand end, as viewed in FIGS. 3 and 4, the interior of housing base 48 is formed with an elevated platform portion 107 having, as best seen in FIG. 4, a U-shaped recess facing gear 98. Within recess 108, an idler wheel 110 is mounted for free rotation upon a stub shaft 112 having its lower end seated in a bore 114 in base 48 and having its upper end fixedly seated within a bore in a rigid mounting strap 116. As best seen in FIG. 4, strap 116 bridges recess 108 and is fixedly secured, as by screws 120, to platform 107.

Cable 34 is of a well known commercially available construction having a transversely flexible central core 34A around which a wire like member 34B is helically wound over the entire length of the cable 34.

Cable 34 is guided in movement through housing base 48 by a pair of aligned passages 122 through platform portion 107 of the housing which open at opposite sides of the U-shaped recess 108. Within the recess 108, the cable 34 is gripped between the opposed peripheries of drive gear 98 and idler wheel 110, the cable 34 tangentially engaging both of these peripheries. The helical winding 34B on the cable 34 is formed with a pitch such that the teeth of gear 98 are meshed between adjacent turns of the winding 34B in a positive drive relationship, this meshed engagement being maintained by the pressure applied by idler wheel 110 to the cable 34. This positive meshed engagement between gear 98 and cable 34 establishes a constant fixed relationship between longitudinal displacement of cable 34 and rotative displacement of gear 98. Power driven rotation of gear 98 requires a corresponding longitudinal displacement of cable 34, and longitudinal displacement of cable 34 induced by manual movement of the sliding door D which is coupled to the cable 34 will require a corresponding rotative movement of gear 98. The rotative position of gear 98, or more accurately, the rotary displacement of gear 98 from a selected rotative rest or home position, is thus representative of the position of the sliding door D on its path of movement relative to the van V, regardless of whether the door D has been located in that position by powered or by manual movement.

The rotative displacement of gear 98 from a preselected start position represents the position of the door D along its path of travel and is utilized by the electronic control unit 56 to control the bidirectional energization of drive motor 40. A position encoder means transmits signals to the electronic control unit 56 representative of the door D position in turn represented by the rotative position of gear 98. The position encoder means includes an encoder disc or wheel 124 which is fixedly secured upon the top of hub 94 in rotatively fixed relationship to gear 98. In the exemplary form shown in FIGS. 3 and 7, the encoder wheel 124 is constructed with a series of upwardly projecting uniformly spaced, solid teeth 126 with apertures disposed between adjacent teeth 126.

Figure 7:
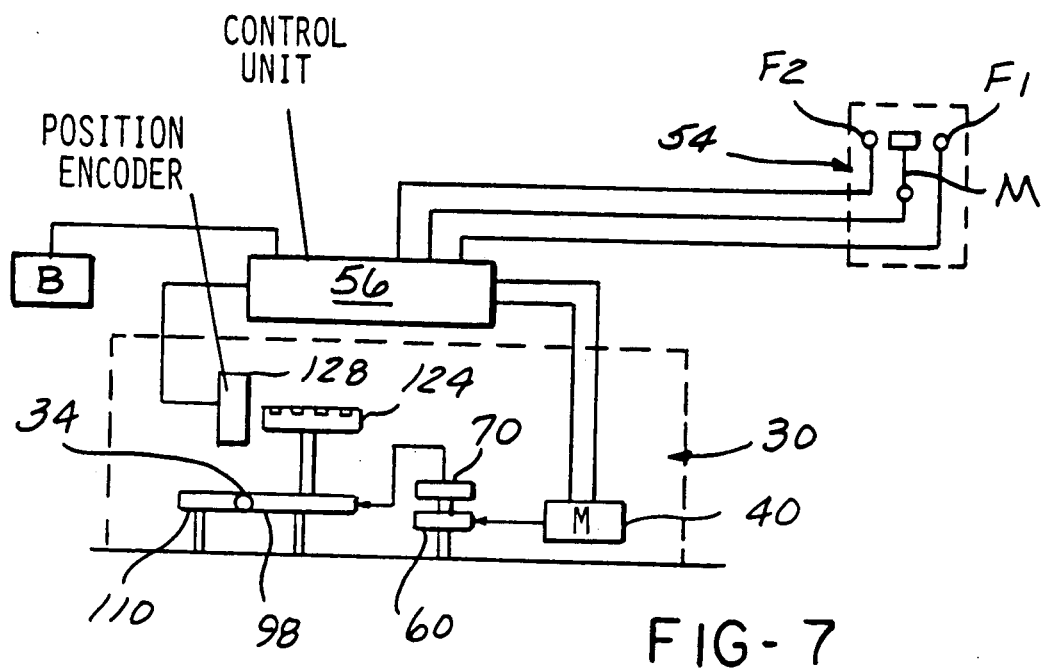
FIG. 7 is a schematic diagram indicating the relationship of the power drive to its control units.
Figure 8:
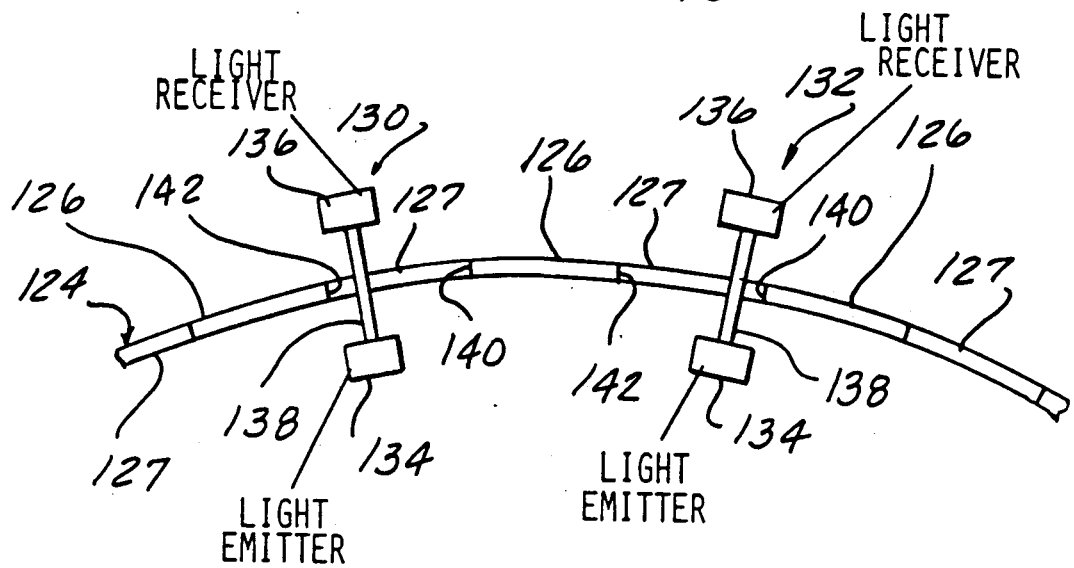
FIG. 8 is a partial plan view of the encoder wheel and photoelectric means utilized in the position encoder of the present invention.

As shown in FIGS. 3, 7 and 8, the position encoder means 128 includes the rotatable encoder wheel 124 and first and second photoelectric means 130 and 132, respectively, which are mounted in spaced relationship with respect to the periphery of the encoder wheel 124. The first and second photoelectric means 130 and 132, respectively, each comprise a light emitter 134 and a light receiver 136. The light emitter 134 and light receiver 136 are disposed on opposite sides of the peripheral teeth 126 on the encoder wheel 124 and are fixedly mounted on a circuit board 131 attached to the cover 44.

Each light emitter 134 and light receiver 136 are oriented and operate to generate a light beam 138 which extends from the light emitter 134 to the light receiver 136 through one of the apertures 127 in the encoder wheel 124. As the wheel 124 rotates, the spaced teeth 126 will sequentially pass between each emitter 134 and receiver 136 in the first and second photoelectric means 130 and 132 and break the beam 138. This generates a signal indicative of the passage of one tooth 126 on the encoder wheel 124.

Since the encoder wheel 124 is coupled through the gear 88 to the cable 34, the number of pulses generated by the photoelectric means 130 and 132 corresponds to the travel distance of the door D on the van V. The rest position from which the count is started preferably is established by locating the door D in its fully closed position and establishing the rotative position of gear 98 when the door D is closed as the zero count position.

As shown in FIG. 8, each of the apertures 127 in the encoder wheel 124 is located between two edges 140 and 142 on adjacent solid teeth 126. The first and second photoelectric means 130 and 132 are spacedly mounted a predetermined distance apart such that the first photoelectric means 130 will detect a transition from an aperture 127 to a solid tooth 126, such as when the encoder wheel 124 is rotating counterclockwise as viewed in FIG. 8, before the second photoelectric means 132 detects a similar transition between another aperture 127 and another solid tooth 126. An opposite sequence occurs when the encoder wheel 124 is rotating in a clockwise direction. This sequence of signals from the first and second photoelectric means 130 and 132 is used by the control unit 56 according to its control program to determine the direction of movement of the door D.

The first and second photoelectric means 130 and 132 are spaced apart to detect the transition of different apertures 127 to different solid teeth 126 since the speed of the encoder wheel 124 is sufficiently fast so as to require the two light beams of the first and second photoelectric means 130 and 132 to be too close together if they were arranged to detect the same aperture to tooth transition. This could result in light bleed-over between the first and second photoelectric means 130 and 132 and thereby cause inaccurate operation of the position encoder.

A schematic diagram of the drive system is shown in FIG. 7. The control switch 54 which controls powered operation of the system takes the form of a switch of the type employed to control power operated windows or sun roofs. The switch has a movable contact M connected to a source of electric power and located between, but out of contact with a spaced pair of fixed contacts F1, F2. When the movable contact M is manually shifted and held in contact with the fixed contact F1, motor 40 will drive in one direction as long as the contact M is held closed or until control unit 56 determines the door D has reached an end limit of movement and accordingly opens the circuit to motor 40. Shifting of the movable contact M to the other fixed contact F2 will cause the motor 40 to drive in the opposite direction in a similar manner.

As explained above, the shaft of motor 40 is in positive meshed engagement with the input gear 60 of the centrifugal clutch. Rotation of the driving gear 60 in either direction will cause the clutch to engage and positively couple input gear 60 of the clutch to its output gear 70. Gear 70 in turn drives gear 88 and, via hub 90, both gear 98 and encoder disc 124 rotate with gear 88. Rotation of gear 98 is directly transmitted to cable 34 via the positive intermeshed engagement of gear 98 with cable 34. Cable 34 in turn is coupled to the sliding door D so that longitudinal movement of the cable 34 forwardly or rearwardly along its guide track 36 causes a corresponding forward or rearward movement of the door D. The signals transmitted by receivers 136 to the control unit 56 enables the control unit 56 to compute at all times the location of the door D along its path of movement. This is essential for the proper operation of the door power system.

The control unit 56 also computes the rate that the signals are generated by the receivers 136 of the first and second photoelectric means 130 and 132. This rate will normally be constant as the door D traverses along its path of movement. However, if the door D meets an obstruction during such movement, the signal rate will instantaneously and sharply decrease thereby indicating that an obstruction has been met at which time the control unit 56 will deactivate or reverse the motor 40. Further, the end of travel of the door D when it reaches its fully opened or fully closed position and is in contact with the door frame or door striker is also interpreted by the control unit 56 as an obstruction since the door D is prohibited from further movement. At this time, the control unit 56 will also only deactivate the motor 40.

Optionally, the control unit 56 may be programmed to provide either a continuous powered activation of the motor 40 or a momentary express activation of the motor 40. If, for example, the movable contact M is shifted into contact with one of the fixed contacts F1 or F2 for a predetermined amount of time, such as less than 300 milliseconds, the control unit 56 will activate the motor 40 to drive the door D to its corresponding end limit of movement in an express, continuous mode. Momentary switching of the movable contact M into contact with either of the fixed contacts F1 or F2 after the initial contact period will generate a signal to the control unit 56 causing the control unit 56 to deactivate or reverse the motor 40 and cancel the "express" power drive. Alternately, the control unit 56 may be programmed to activate the motor 40 only as long as the movable contact M is held in contact with one of the fixed contacts F1 or F2 by the operator. This feature can be combined with the momentary express activation of the motor 40 since the operator must hold the movable contact M in contact with one of the fixed contacts F1 or F2 for a time greater than the predetermined time required to activate the momentary express drive.

While the primary purpose of the power drive is to provide the capability of controlling powered opening and closing of the sliding door D from the driver's seat, there are frequent occasions when manual operation of the door D is preferable or more convenient. The driver may, for example, load an article into the van V through the open door D and wish to close the door D before returning to the driver's seat. The system described above automatically mechanically disconnects the drive motor 40 from the door D at all times when the drive motor 40 is not in operation so that the door D may be manually operated without interference or resistance from the drive motor 40. The centrifugally actuated clutch establishes a positive drive connection between the drive motor 40 and door D automatically when the motor 40 is operated and disengages when the motor 40 is stopped. However, the ability of the electronic control unit 56 to control powered operation of the door D at selected positions along the path of travel of the door D is totally unaffected by the mechanical disengagement of the clutch because the door position signal supplied to the electronic control unit 56 is generated by that portion of the drive which is mechanically positively connected to the door D at all times, whether the clutch is engaged or disengaged. Thus, the door D may, for example, be power driven to its open position under the control of its electronic control unit, and then manually closed without mechanical interference from the drive or alteration of the programmed control of powered operation.

What is claimed is:

1. A position encoder for a vehicle mounted sliding door which is movable along a fixed path between door opened and door closed positions in which an elongate door drive member is coupled to the door for longitudinal forward and rearward movement with the door, first rotary means are positively mechanically engaged with the door drive member for rotation coordinated with longitudinal forward and rearward movement of the door drive member, a bidirectional drive motor has a rotary output shaft, a clutch means positively mechanically couples the motor output shaft to the first rotary means in response to rotation of the output shaft in either direction and for accommodating free rotation of the first rotary means relative to the output shaft when the shaft is stationary, and a control means for selectively operating the drive motor, the position encoder comprising:

a rotatable encoder wheel positively mechanically connected to said first rotary means, said encoder wheel having a plurality of circumferentially spaced apertures between solid teeth, said encoder wheel adapted for rotation with said first rotary means;

first and second photoelectric means mounted in spaced relationship with the apertures in the wheel;

each of the first and second photoelectric means including a light emitter and a light receiver, the light emitter and light receiver being disposed on opposite sides of the teeth on the encoder wheel to detect the passage of the teeth therebetween;

each of the first and second photoelectric means generating an output to the control means indicative of the passage of each tooth past the first and second photoelectric means, respectively, the control means counting the outputs of the first and second photoelectric means to determine the actual position of the door;

the first and second photoelectric means being spaced apart a distance such that each of the first and second photoelectric means is positioned to independently detect the passage of a different tooth in the encoder wheel therepast; and the control means determining the direction of movement of the encoder wheel and the door from the outputs from the first and second photoelectric means.

2. The position encoder of claim 1 wherein:

each aperture in the encoder wheel has a first length bounded by first and second edges of adjacent solid portions of the teeth of the encoder wheel; and the first and second photoelectric means being spaced a distance apart such that one of the first and second photoelectric means detects a transition from an aperture to a solid portion of a tooth on the encoder wheel as the encoder wheel rotates in a first direction before the other of the first and second photoelectric means detects a transition between a different aperture and a solid portion of a different tooth of the encoder wheel.

3. The position encoder of claim 1 wherein the control means further includes:

program means for determining the rate of input of the signals from the first and second photoelectric means and for determining when the deceleration of the rate of the signals exceeds a predetermined value to cause the control means to deactivate the drive motor means.

4. In a vehicle sliding door apparatus accommodating either manual or powered operations of a vehicle mounted sliding door which is movable along a fixed path between door opened and door closed positions in which an elongate door drive member is coupled to the door for longitudinal forward and rearward movement with the door, first rotary means are positively mechanically engaged with the door drive member for rotation coordinated with longitudinal forward and rearward movement of the door drive member, a bidirectional drive motor has a rotary output shaft, a clutch means positively mechanically couples the output shaft to the first rotary means in response to rotation of the output shaft in either direction and for accommodating free rotation of the first rotary means relative to the output shaft when the shaft is stationary, and a control means for selectively operating the drive motor, the improvement comprising:

position encoder means for generating position signals indicative of the travel distance of the door as the door moves in forward and rearward directions along the fixed path between a door opened and a door closed position, the position encoder means comprising:

a rotatable encoder wheel positively mechanically connected to said first rotary means, said encoder wheel having a plurality of circumferentially spaced apertures between solid teeth, said encoder wheel adapted for rotation with said first rotary means;

first and second photoelectric means mounted in spaced relationship with the apertures in the wheel;

each of the first and second photoelectric means including a light emitter and a light receiver, the light emitter and light receiver being disposed on opposite sides of the teeth on the encoder wheel to detect the passage of the teeth therebetween;

each of the first and second photoelectric means generating an output to the control means indicative of the passage of each tooth past the first and second photoelectric means, respectively, the control means counting the outputs of the first and second photoelectric means to determine the actual position of the door;

the first and second photoelectric means being spaced apart a distance such that each of the first and second photoelectric means is positioned to independently detect the passage of a different tooth in the encoder wheel therepast; and the control means determining the direction of movement of the encoder wheel and the door from the outputs from the first and second photoelectric means.

5. The improvement of claim 4 wherein:

each aperture in the encoder wheel has a first length bounded by first and second edges of adjacent solid portions of the teeth of the encoder wheel; and the first and second photoelectric means being spaced a distance apart such that one of the first and second photoelectric means detects a transition from an aperture to a solid portion of a tooth on the encoder wheel as the encoder wheel rotates in a first direction before the other of the first and second photoelectric means detects a transition between a different aperture and a solid portion of a different tooth of the encoder wheel.

6. The improvement of claim 4 wherein program means for determining the rate of input of the signals from the first and second photoelectric means and for determining when the deceleration of the rate of the signals exceeds a predetermined value to cause the control means to deactivate the drive motor means.

7. A vehicle sliding door position encoder comprising:

a vehicle mounted sliding door movable along a fixed path between door opened and door closed positions;

an elongate door drive member coupled to the door for longitudinal forward and rearward movement with the door;

first rotary means positively mechanically engaged with the door drive member for rotation coordinated with longitudinal forward and rearward movement of the door drive member;

a bidirectional drive motor having a rotary output shaft;

a clutch means positively mechanically coupling said motor output shaft to said first rotary means in response to rotation of said output shaft in either direction and for accommodating free rotation of said first rotary means relative to said output shaft when said output shaft is stationary;

control means for selectively operating said drive motor;

a rotatable encoder wheel positively mechanically connected to said first rotary means, said encoder wheel having a plurality of circumferentially spaced apertures between solid teeth, said encoder wheel adapted for rotation with said first rotary means;

first and second photoelectric means mounted in spaced relationship with the apertures in the wheel;

each of the first and second photoelectric means including a light emitter and a light receiver, the light emitter and light receiver being disposed on opposite sides of the teeth on the encoder wheel to detect the passage of the teeth therebetween;

each of the first and second photoelectric means generating an output to the control means indicative of the passage of each tooth past the first and second photoelectric means, respectively, the control means counting the outputs of the first and second photoelectric means to determine the actual position of the door;

the first and second photoelectric means being spaced apart a distance such that each of the first and second photoelectric means is positioned to independently detect the passage of a different tooth in the encoder wheel therepast; and the control means determining the direction of movement of the encoder wheel and the door from the outputs from the first and second photoelectric means.

8. The vehicle sliding door position encoder of claim 7 further comprising:

each aperture in the encoder wheel having a first length bounded by first and second edges of adjacent solid portions of the teeth of the encoder wheel; and the first and second photoelectric means being spaced a distance apart such that one of the first and second photoelectric means detects a transition from an aperture to a solid portion of a tooth on the encoder wheel as the encoder wheel rotates in a first direction before the other of the first and second photoelectric means detects a transition between a different aperture and a solid portion of a different tooth of the encoder wheel.

9. The vehicle sliding door position encoder of claim 8 further comprising:

program means for determining the rate of input of the signals from the first and second photoelectric means and for determining when the deceleration of the rate of the signals exceeds a predetermined value to cause the control means to deactivate the drive motor means.

* * * * *